(12) United States Patent
Zhao

(10) Patent No.: US 10,597,215 B2
(45) Date of Patent: Mar. 24, 2020

(54) PANEL FIXING DEVICE

(71) Applicant: HUIZHOU CHINA STAR OPTOELECTRONICS TECHNOLOGY CO., LTD., Huizhou, Guangdong (CN)

(72) Inventor: Zhilin Zhao, Huizhou Guangdong (CN)

(73) Assignee: HUIZHOU CHINA STAR OPTOELECTRONICS TECHNOLOGY CO., LTD., Huizhou (CN)

( * ) Notice: Subject to any disclaimer, the term of this patent is extended or adjusted under 35 U.S.C. 154(b) by 7 days.

(21) Appl. No.: 15/943,373

(22) Filed: Apr. 2, 2018

(65) Prior Publication Data

US 2019/0202618 A1    Jul. 4, 2019

Related U.S. Application Data

(63) Continuation of application No. PCT/CN2018/074285, filed on Jan. 26, 2018.

(30) Foreign Application Priority Data

Dec. 28, 2017 (CN) .......................... 2017 1 1463876

(51) Int. Cl.
*B65D 81/05* (2006.01)
*H01L 21/673* (2006.01)
(Continued)

(52) U.S. Cl.
CPC ......... *B65D 81/052* (2013.01); *B65D 25/107* (2013.01); *B65D 81/02* (2013.01);
(Continued)

(58) Field of Classification Search
CPC ................ B65D 81/052; B65D 25/107; B65D 81/1075; B65D 85/48; B65D 81/051;
(Continued)

(56) References Cited

U.S. PATENT DOCUMENTS 3,811,173 A * 5/1974 Baumann ............... B65D 90/02
29/460
3,912,107 A * 10/1975 Baumann ............... B65D 90/02
220/563
(Continued)

FOREIGN PATENT DOCUMENTS

CN         101439778 A    5/2009
CN         201367197 A    12/2009
(Continued)

*Primary Examiner* — Anthony D Stashick
*Assistant Examiner* — Blaine G Neway
(74) *Attorney, Agent, or Firm* — Hemisphere Law, PLLC; Zhigang Ma

(57) ABSTRACT

The present disclosure discloses a panel fixing device, including a box, a pressing member and an expansion agent. The inner wall of the frame of the box is provided with a limiting groove, the pressing member is movably disposed in the limiting groove, the frame has a receiving through hole connecting with the limiting groove, the expansion agent is received in the receiving through hole, and the expansion agent is used for pushing the pressing member after being expanded so that the pressing member compresses the panel accommodated in the box. An injection channel of the expansion agent is reserved on the box. After inflating the expansion agent, the pressing member is pushed by the expansion force, so that the pressing member compresses the panel in the box to limit the panel so as to prevent the box from causing a second impact during the dropping process.

10 Claims, 2 Drawing Sheets

(51) Int. Cl.
  *B65D 25/10* (2006.01)
  *B65D 81/107* (2006.01)
  *B65D 85/48* (2006.01)
  *B65D 81/02* (2006.01)

(52) U.S. Cl.
  CPC ......... *B65D 81/1075* (2013.01); *B65D 85/48* (2013.01); *H01L 21/67363* (2013.01); *H01L 21/67369* (2013.01)

(58) Field of Classification Search
  CPC ...... B65D 81/05; B65D 25/10; B65D 25/101; B65D 25/103; H01L 21/67363; H01L 21/67369
  See application file for complete search history.

(56) References Cited

U.S. PATENT DOCUMENTS

| | | | | |
|---|---|---|---|---|
| 5,375,898 | A * | 12/1994 | Ohmori | B65B 43/54 294/207 |
| 5,868,181 | A * | 2/1999 | Alvern | B67D 7/421 137/379 |
| 8,599,331 | B2 * | 12/2013 | Zhao | G02F 1/133308 349/58 |
| 9,376,251 | B2 * | 6/2016 | Hong | B65D 81/107 |

FOREIGN PATENT DOCUMENTS

| | | |
|---|---|---|
| CN | 103662424 | 3/2014 |
| CN | 103786979 | 5/2014 |
| CN | 104386358 | 3/2015 |
| CN | 104401598 | 3/2015 |
| CN | 204384077 A | 6/2015 |
| CN | 104891038 A | 9/2015 |
| CN | 107284824 | 10/2017 |
| CN | 206719798 U | 12/2017 |
| GB | 1327008 A | 8/1973 |
| JP | 09226867 A | 9/1997 |

\* cited by examiner

PANEL FIXING DEVICE

RELATED APPLICATIONS

The present application is a Continuation Application of International Application Number PCT/CN2018/074285, filed Jan. 26, 2018, and claims the priority of China Application No. 201711463876.X, filed Dec. 28, 2017.

FIELD OF THE DISCLOSURE

The present disclosure relates to the field of panel processing, and more particularly to a panel fixing device.

BACKGROUND OF THE DISCLOSURE

The panel industry has a variety of ways to package liquid crystal glass. The most commonly used foaming-type mold-forming cushioning material is made into a tray to hold liquid crystal glass. There is also a solution for injection molding/blow molding of rigid boxes. Relatively speaking, the current industry most commonly used foam tray, take its advantages of light weight, good cushioning effect, liquid crystal glass can be in direct contact with the outer box; plastic injection molding, rigid plastic outer box than rigid foam strength of the box, but the basic no buffer performance, need to stick within the soft retaining wall buffer.

The above conventional packing boxes are used to directly put the liquid crystal glass into the box, so the unilateral clearance between the box and glass about 2~8 mm range. The gap setting is limited by the accuracy of the box process. The more accurate the process tolerance, the smaller the preset gap may be, but the gap may not be zero because there must be a matching gap in the way that the two parts are assembled.

Some scholars have shown that there is a gap between the contents and the outer box may cause the package during the drop second impact, the destructive power of the contents of a shock several times. The larger the tolerance of the box, the more uncontrollable the clearance when matched with the contents, the more unpredictable the protection performance of the package against the contents. If can make the package to zero clearance, can maximize the avoidance of secondary shocks, packaging can be the most efficient protection of the contents. In addition, for ultra-high-definition panel products, the printed circuit board and the chip-on-film from the LCD cell edge margin is extremely small, together with the foam packaging manufacturing tolerance is too large, resulting in the OC into the box is difficult to access a sufficient area of the retaining wall. The box is difficult to provide sufficient cushioning properties, and different specifications of the same type of product should be as common as possible to maintain the packaging, packaging design more difficult.

SUMMARY OF THE DISCLOSURE

The technical problem to be solved by the present disclosure is to overcome the shortcomings of the prior art and to provide a panel fixing device capable of tightly fixing a panel.

In order to achieve the above object, the present disclosure adopts the following technical solutions.

A panel fixing device, including a box, a pressing member and an expansion agent, wherein the inner wall of the frame of the box is provided with a limiting groove, the pressing member is movably disposed in the limiting groove, the frame has a receiving through hole connecting with the limiting groove, the expansion agent is received in the receiving through hole, and the expansion agent is used for pushing the pressing member after being expanded so that the pressing member compresses the panel accommodated in the box.

Optionally, the surface of the pressing member facing the receiving through hole is partially recessed to form a receiving groove, when the expansion agent is expanded, the expansion agent partially expands into the receiving groove to push the pressing member so that the pressing member compresses the panel accommodated in the box.

Optionally, two ends of the receiving groove respectively penetrate two opposite sidewalls of the pressing member, and the two ends of the receiving groove extend in a direction perpendicular to the moving direction of the pressing member.

Optionally, the pressing member further includes an extending portion disposed on the side wall of the pressing member, and an extending direction of the extending portion is perpendicular to the moving direction of the pressing member, a limiting portion is provided in the limiting groove, and the extending portion is received in the limiting portion.

Optionally, the number of the extending portions is two, and the two extending portions are oppositely disposed.

Optionally, the extending direction of the receiving through hole is parallel to the moving direction of the pressing member, one end of the receiving through hole penetrates the inner wall of the limiting groove facing the receiving groove, and the other end of the receiving through hole penetrates the outer wall of the frame.

Optionally, the expansion agent is made of polyurethane foam plastic.

Optionally, the panel fixing device further includes a sealing member for sealing one end of the receiving through hole located at the outer wall of the frame.

Optionally, the number of the pressing members is plural, and the plurality of the pressing members are spaced around a plurality of the frames of the box.

The present disclosure discloses a panel fixing device. A pressing member is arranged on the box and the injection channel of the expansion agent is reserved on the box. After inflating the expansion agent, the pressing member is pushed by the expansion force of the expansion agent, so that the pressing member compresses the panel in the box to limit the panel so as to prevent the box from causing a second impact during the dropping process.

DETAILED DESCRIPTION OF PREFERRED EMBODIMENTS

In order to make the objectives, technical solutions and advantages of the present disclosure more comprehensible, the present disclosure is further described in detail below with reference to the accompanying drawings and embodiments. It should be understood that the specific embodiments described herein are only used to explain the present disclosure and are not intended to limit the present disclosure.

Figure 1:
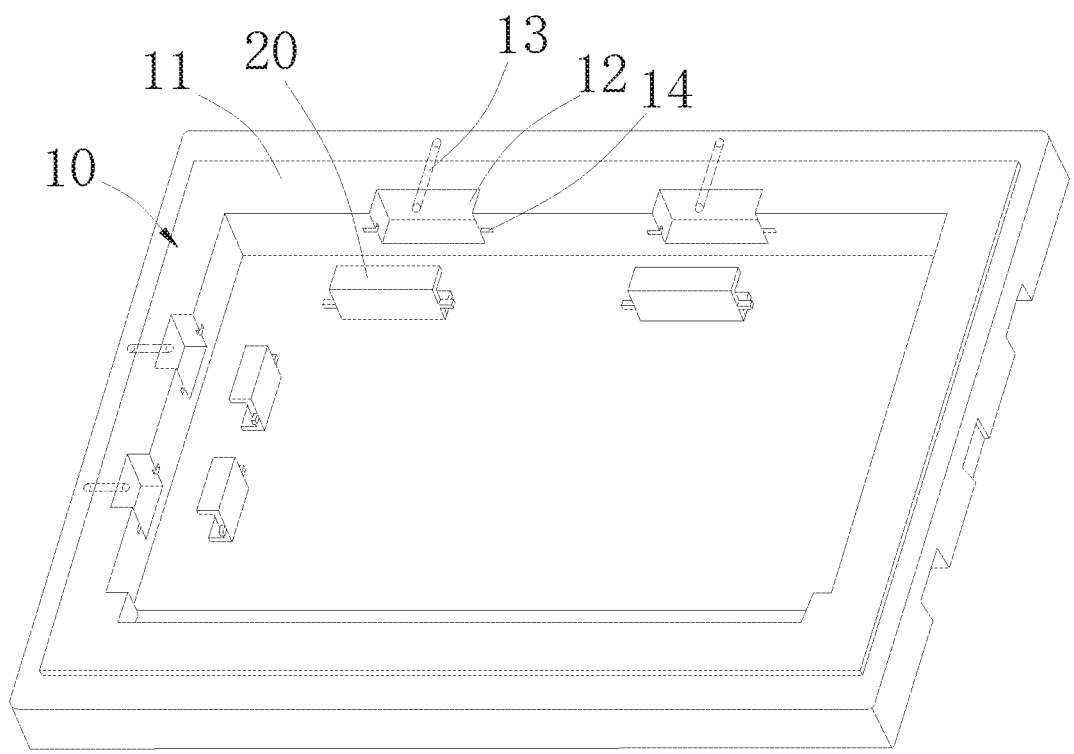
FIG. 1 is an exploded diagram of the panel fixing device according to the embodiment of the present disclosure.
Figure 2:
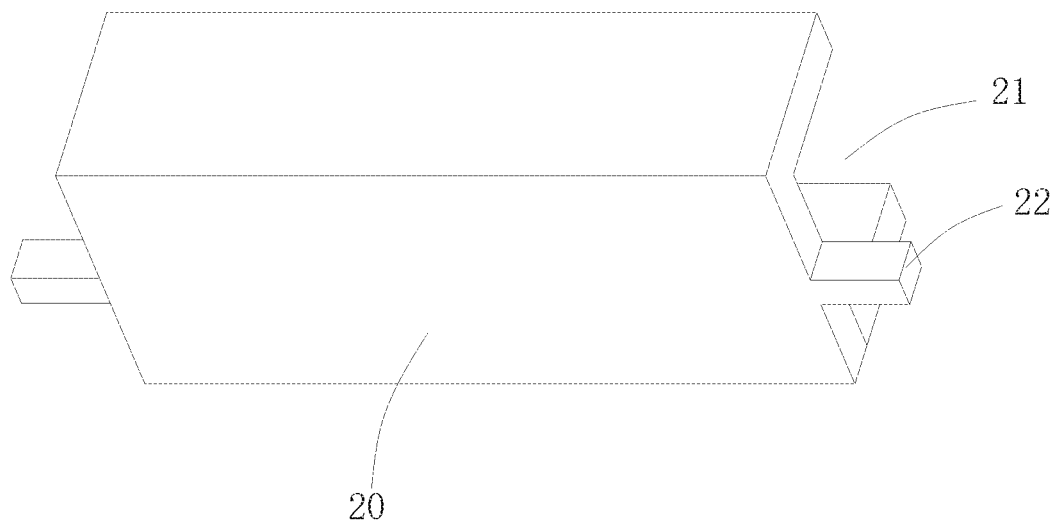
FIG. 2 is a schematic diagram of the pressing device according to the embodiment of the present disclosure.

As shown in FIG. 1, the panel fixing device of the embodiment mainly includes a box 10, a pressing member 20 and an expansion agent. Wherein, the inner wall of the frame 11 of the box 10 is provided with a limiting groove 12, the pressing member 20 is movably disposed in the limiting groove 12, a receiving through hole 13 connecting with the limiting groove 12 is provided in the frame 11, the expansion agent is disposed in the receiving through hole 13, and the expansion agent is used to expand and push the pressing member 20 so that the pressing member 20 presses the panel accommodated in the box 10. In this way, the panel and the box 10 are in close contact with each other so as to prevent the box from dropping to cause secondary impact on the panel.

As a preferred embodiment, the surface of the pressing member 20 facing the receiving through hole 13 is partially recessed to form a receiving groove 21, when the expansion agent is expanded, the expansion agent partially expands into the receiving groove 21 to push the pressing member 20 to compress the panel received in the box 10. By providing the receiving groove 21, a larger space for expansion of the expansion agent is provided, so that the expansion agent exerts greater thrust on the pressing member 20 so that the pressing member can be brought into closer contact with the liquid crystal panel to achieve a better position restriction.

Figure 3:
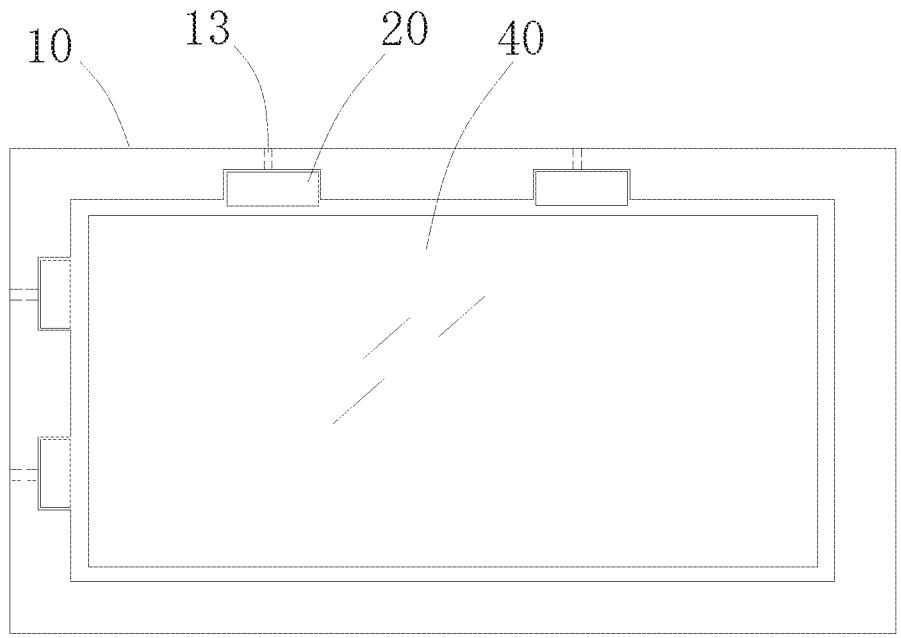
FIG. 3 is a top view of the panel fixing device when the expansion agent according to the embodiment of the present disclosure is in an unexpanded state.

Specifically, as shown in FIG. 3, two ends of the receiving groove 21 respectively extend through two opposite sidewalls of the pressing member 20, and the extending directions of the two ends of the receiving groove 21 are respectively perpendicular to the moving direction of the pressing member 20. The length of the receiving groove 21 is the same as that of the pressing member 20, so that the area of contact between the expanding agent and the pressing member 20 is larger and the pressing force of the pressing member 20 is more uniform. In addition, a part of the expansion agent can overflow from the openings on both sides of the receiving groove 21, and the overflowed partial expansion agent is used to fill the gap between the side wall of the pressing member 20 and the inner wall of the limiting groove 12. In this way, the expansion agent can limit the pressing member 20 in a direction perpendicular to the moving direction of the pressing member 20 after the expansion agent is solidified to prevent the pressing member 20 from being displaced.

Further, the pressing member 20 further includes an extending portion 22 provided on the sidewall of the pressing member 20, and the extending portion 22 extends in a direction perpendicular to the moving direction of the pressing member 20. A limiting portion 14 is disposed in the limiting groove 12, and the extension portion 22 is received in the limiting portion 14. On the one hand, it is beneficial to the movement of the pressing member 20 to prevent the pressing member 20 from falling out of the limiting groove 12; on the other hand, the pressing member 20 can be prevented from being displaced during the movement.

As a preferred embodiment, the number of the extending portions 22 is two, and the two extending portions 22 are oppositely disposed. In this way, the pressing member 20 can be limited from both sides to ensure the stability of the pressing member 20 in the moving direction, Of course, in other embodiments, the number of the extending portions 22 may also be other.

Specifically, the receiving through hole 13 is preferably a circular through hole, the extending direction of the receiving through hole 13 is parallel to the moving direction of the pressing member 20. One end of the receiving through hole 13 penetrates the inner wall of the limiting groove 12 opposite to the receiving groove 21, and the other end of the receiving through hole 13 penetrates the outer wall of the frame 11 to facilitate injection of the expanding agent, meanwhile, the uniqueness of the expansion agent in pushing the pressing member 20 is ensured, so as to avoid the shift when the pressing member 20 moves.

Further, the material of the expanding agent is preferably polyurethane foaming glue. In specific use, an injection gun is used to inject polyurethane styrofoam into the receiving through hole 13. After the styrofoam foam expands and expands, the pressing member 20 is pushed towards the panel until the panel is pressed. Of course, in other embodiments, the material of the expansion agent can also be selected as AB glue.

Further, the panel fixing device further includes a sealing member for sealing one end of the receiving through hole 13 that is located on the outer wall of the frame 11. After the material of the expansion agent is injected into the receiving through hole 13, the inlet for receiving the through hole 13 is sealed with a sealing member to prevent the material of the expanding agent from overflowing to the outside of the box 10 during the expansion process, the pushing effect of the expanding agent on the pressing member 20 is ensured. As a preferred embodiment, the sealing member adopts a strong label. After the material of the expanding agent is injected into the receiving through hole 13, the inlet of the through hole 13 can be directly attached with a strong label. Of course, in other embodiments, the sealing member is also provided with a rubber plug. After the material of the expansion agent is injected into the receiving through hole 13, the inlet of the receiving through hole 13 is plugged with a rubber stopper.

Figure 4:
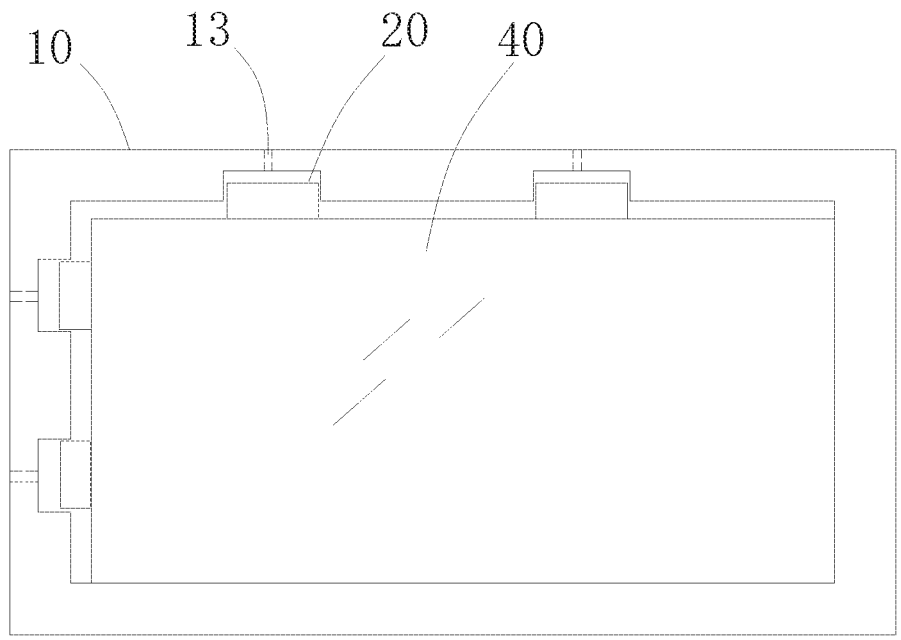
FIG. 4 is a top view of the panel fixing device when the expansion agent according to the embodiment of the present disclosure is in an expanded state.

Specifically, the number of the pressing members 20 is plural, and the plurality of pressing members 20 are spacedly disposed on the plurality of frames 11 of the box 10. As a preferred embodiment, as shown in FIGS. 3 and 4, the box 10 is provided with two pressing members 20 respectively on two mutually perpendicular frames 11. When the panel 40 is pressed, the four pressing members 20 push the panel 40 at the same time until the sidewalls of the panel respectively abut against the other frame 11 not provided with the pressing member 20, thereby positioning the panel.

Of course, in other embodiments, each frame 11 of the box 10 is provided with a pressing member 20, and each of the pressing members 20 is pushed by the expansion agent to press the panel respectively so that the panel is sandwiched between the pressing members 20.

The panel of the embodiment of the present disclosure is preferably an Ultra Definition (UD) type liquid crystal panel, but the present disclosure is not limited thereto.

The present disclosure discloses a panel fixing device. A pressing member is arranged on a box and an injection channel of an expansion agent is reserved on the box. After inflating the expansion agent, the pressing member is pushed by the expansion force of the expansion agent, so that the pressing member compresses the panel in the box to limit the panel so as to prevent the box from causing a second impact during the dropping process.

While specific embodiments of the present disclosure have been described in detail, some embodiments have been shown and described. It will be understood by those skilled in the art that, these embodiments may be modified and improved without departing from the spirit and scope of the present disclosure as defined by the claims and their equivalents, and such modifications and improvements should also fall within the protection scope of the present disclosure.

What is claimed is:

1. A panel fixing device, comprising a box, a pressing member and an expansion agent, wherein an inner wall of a frame of the box is provided with a limiting groove, the pressing member is movably disposed in the limiting groove, the frame has a receiving through hole connecting with the limiting groove, the expansion agent is received in the receiving through hole;

wherein a surface of the pressing member facing the receiving through hole is partially recessed to form a receiving groove, when the expansion agent is expanded, the expansion agent partially expands into the receiving groove to push the pressing member so that the pressing member compresses the panel accommodated in the box;

wherein an extending direction of the receiving through hole is parallel to the moving direction of the pressing member, one end of the receiving through hole penetrates an inner wall of the limiting groove facing the receiving groove, and the other end of the receiving through hole penetrates an outer wall of the frame; and wherein the panel fixing device further comprises a sealing member for sealing one end of the receiving through hole located at the outer wall of the frame.

2. The panel fixing device according to claim 1, wherein two ends of the receiving groove respectively penetrate two opposite sidewalls of the pressing member, and the two ends of the receiving groove extend in a direction perpendicular to a moving direction of the pressing member.

3. The panel fixing device according to claim 2, wherein the pressing member further comprises an extending portion disposed on the side wall of the pressing member, and an extending direction of the extending portion is perpendicular to the moving direction of the pressing member, a limiting portion is provided in the limiting groove, and the extending portion is received in the limiting portion.

4. The panel fixing device according to claim 3, wherein a number of the extending portions is two, and the two extending portions are oppositely disposed.

5. The panel fixing device according to claim 1, wherein the expansion agent is made of polyurethane foam plastic.

6. The panel fixing device according to claim 1, wherein the number of the pressing members is plural, and the plurality of the pressing members are spaced around a plurality of the frames of the box.

7. The panel fixing device according to claim 6, wherein two ends of the receiving groove respectively penetrate two opposite sidewalls of the pressing member, and the two ends of the receiving groove extend in a direction perpendicular to a moving direction of the pressing member.

8. The panel fixing device according to claim 7, wherein the pressing member further comprises an extending portion disposed on the side wall of the pressing member, and an extending direction of the extending portion is perpendicular to the moving direction of the pressing member, a limiting portion is provided in the limiting groove, and the extending portion is received in the limiting portion.

9. The panel fixing device according to claim 8, wherein a number of the extending portions is two, and the two extending portions are oppositely disposed.

10. The panel fixing device according to claim 6, wherein the expansion agent is made of polyurethane foam plastic.

* * * * *